United States Patent [19]

Kato

[11] Patent Number: 4,470,008

[45] Date of Patent: Sep. 4, 1984

[54] CAPACITANCE SENSOR

[76] Inventor: Ryochi Kato, Yachiyodai Nishi 6-2, Yachiyo-shi, Chiba-ken, Japan

[21] Appl. No.: 394,836

[22] Filed: Jul. 2, 1982

[51] Int. Cl.³ .................... G01R 27/26; G01F 23/26
[52] U.S. Cl. ................................ 324/61 R; 73/304 C; 222/639; 307/118; 307/308; 324/60 CD
[58] Field of Search ............. 73/304 C; 340/530, 620; 222/64; 361/271, 284; 324/61 R, 60 CD; 307/308

[56] References Cited

U.S. PATENT DOCUMENTS

| | | | |
|---|---|---|---|
| 3,254,333 | 5/1966 | Baumoel | 73/304 C |
| 3,588,859 | 6/1971 | Petree | 340/620 |
| 3,939,360 | 2/1976 | Jackson | 73/304 C X |
| 4,001,676 | 1/1977 | Hile et al. | 73/304 C X |
| 4,296,472 | 10/1981 | Sarkis | 364/509 |
| 4,347,740 | 9/1982 | Townsend | 73/304 C |
| 4,423,371 | 12/1983 | Senturia et al. | 324/61 R |

OTHER PUBLICATIONS

Publ. "Two Frequency Oscillator Detects Level of Liquid" by J. Kendall Marsh, Electronics, Mar. 20, 1967, p. 90.
Publication: Laid Open Japanese Application SN 155,889, 12/24/75, U.M. Gazette.

Primary Examiner—Daniel M. Yasich
Attorney, Agent, or Firm—McGlew & Tuttle

[57] ABSTRACT

Disclosed herein is a capacitance sensor which comprises a pulse generating circuit; a plurality of variable delay circuits, each including as a component thereof a variable capacitance transducer and adapted to delay a pulse from the pulse generating circuit by a time lag corresponding to a capacitance value of the transducer and then output the thus-delayed pulse; and a phase discriminating circuit adapted to discriminate a phase difference of the pulses output respectively from the plurality of variable delay circuits and then output measured information. This capacitance sensor can be used to measure various parameters. The capacitance sensor is particularly effective as a liquid level detection sensor for liquid containing bottles used to dispense intravenous substances in drop-wise fashion. It is not required for the above sensor to reset its detectable threshold level for every material or item to be measured, because unnecessary variables such as temperature changes and dielectric constant changes of the material or item are cancelled out. The present capacitance sensor can be reduced in size, weight and fabrication cost. It is also capable of detecting very small changes in capacitance.

4 Claims, 10 Drawing Figures (preferred embodiment of transducers)

63 electrode supporting member
61 electrode
60 common earth electrode
62 electrode ${61 \atop 60}$} transducer 31

${62 \atop 60}$} transducer 32

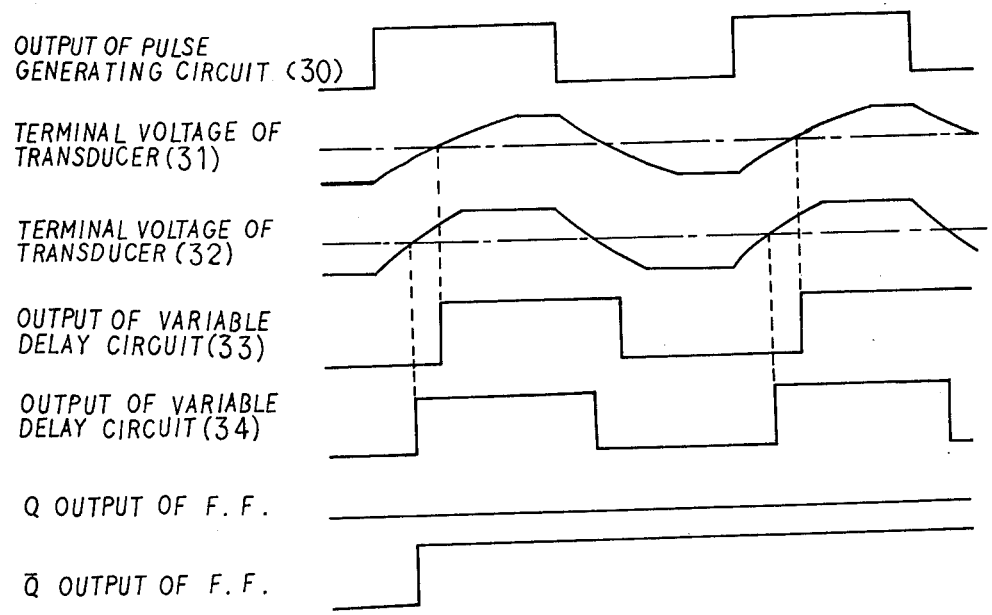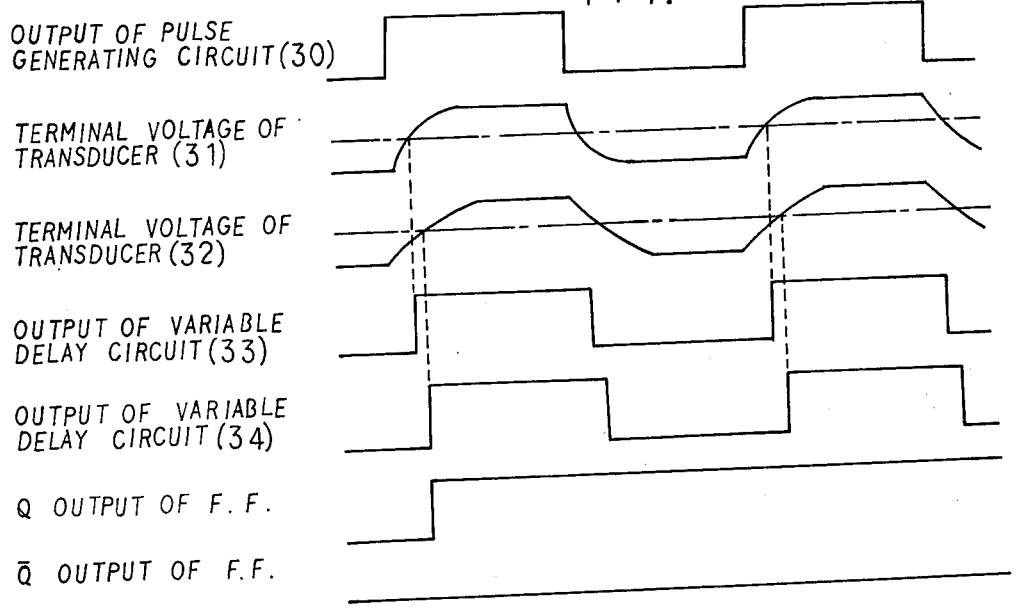

CAPACITANCE SENSOR

BACKGROUND OF THE INVENTION (a) Field of the Invention

This invention relates to an improvement in or relating to a capacitance sensor which is adapted to detect a variety of information by making use of variable capacitance transducers.

(b) Description of the Prior Art

Variable capacitance transducers, which may be considered as a sort of capacitor which is capable of converting some physical or chemical parameter or quantity into a capacitance of a magnitude corresponding to the physical or chemical parameter or quantity, have heretofore been employed, for example, to detect, externally of a an intravenous bottle without making contact with the liquid in the bottle per se, that the level of the liquid has reached a predetermined level. Referring now to FIG. 1 which is a simplified schematic block diagram of a conventional capacitance sensor, the prior art liquid level detection system will be described. On suitable locations of the outer wall of a bottle 10, there are applied in a face-to-face relationship, two electrodes 11, 12 which constitute a transducer. As soon as the level of the liquid 14 within the bottle 10 has fallen down below the electrodes 11, 12, this is detected by sensing a capacitance change between the electrodes 11, 12, which capacitance change has occurred due to a descent of the level of the liquid 14 below the electrodes 11, 12, by a capacitance change detecting circuit 15. The operation of the above conventional capacitance sensor will next be described with reference to FIG. 2. Variations in capacitance of the transducer are diagrammatically illustrated by a solid line 20 in FIG. 2, as a function of the level of the liquid. The capacitance of the transducer becomes maximum $C_{max}$ when the interspace between the electrodes 11 and 12 is filled liquid with the drops. When the drops filling liquid the interspace between the electrodes 11 and 12 is replaced by air, the capacitance of the transducer reaches the minimum level, $C_{min}$. Thus, by setting the detectable threshold level of the capacitance change detecting circuit 15 at a value somewhat higher than the minimum value $C_{min}$, it is possible to carry out the accurate detections of liquid levels at the same detectable threshold level even if the liquid 14 is replaced by other liquid of different dielectric constant $\epsilon$ and the capacitance variations of the other liquid is represented by, for example, broken lines 22, 23 in FIG. 2, to say nothing of a liquid 14 represented by the solid line 20.

The minimum value $C_{min}$ of the interelectrode capacitance varies with environmental conditions for measurement such as the type of bottle used and the temperature. Thus, if the detectable threshold level is set too low, the minimum value $C_{min}$ may in some instance be greater than the threshold level, thereby making the capacitance sensor fail to work. To avoid such a potential danger, it has heretofore been required to reset the threshold level whenever a fresh liquid-containing drop bottle is used, leading to a drawback that the handling of the capacitance sensor is cumbersome.

It has generally been known to employ a circuit which makes use of the AC capacitance bridge method or LC resonance method, as the capacitance change detecting circuit 15. These prior art circuits are however accompanied by drawbacks in that they render devices or instruments unavoidably voluminous and expensive, because the former method requires a complex structure and a stable oscillator and a detection circuit is indispensable for the latter method. It has been proposed, as a countermeasure for the above problems, to employ another capacitance change detecting circuit of a relatively simple structure, in which the oscillation circuit is formed using the capacitance of a transducer as a feedback capacitor so as to detect each capacitance change on the basis of a change in oscillation output. This capacitance change detecting circuit is however accompanied by another drawback in that its use is limited to materials or items which exhibit a large change in capacitance, because it is difficult to control the oscillation output by a small degree of capacitance change. Thus, when a capacitance change detecting circuit of the above type is applied to detect the liquid level of a liquid containing drop bottle, there is a problem in that, for example, a communicating vessel of a small diameter has to be provided with the bottle and it is necessary to put a transducer on the thus-provided communicating vessel since, if its electrodes are provided on the bottle per se as illustrated in FIG. 1, the interelectrode spacing will be too wide to detect a small change in capacitance.

SUMMARY OF THE INVENTION

With the foregoing in view, the present invention has as its object the provision of a capacitance sensor which is capable of detecting, with a compact and economical construction a very small change in physical or chemical quantity on the basis of a very small change in capacitance and requires no resetting or readjustment of its detectable threshold level for every material or item to be measured, thereby enjoying good operability.

In one aspect of this invention, there is thus provided a capacitance sensor which comprises:

a pulse generating circuit;

a plurality of variable delay circuits, each including as a component thereof a variable capacitance transducer and adapted to delay a pulse from said pulse generating circuit by a time lag corresponding to a capacitance value of said transducer and then output the thus-delayed pulse; and a pulse discriminating circuit adapted to discriminate a phase difference of the pulses output respectively from said plurality of variable delay circuits and then output the measured information.

Owing to the above-mentioned construction of the capacitance sensor according to this invention, any unnecessary variables such as temperature changes are mutually cancelled out. Thus, it is not required to reset the detectable threshold level for every material or item to be measured. Since each capacitance change is detected after converting it into a corresponding time lag, the capacitance sensor according to this invention is capable of detecting a very small change in capacitance. The present capacitance sensor features a simple construction, whereby bringing about other advantages in that it can be reduced in both size and fabrication cost. Thus, considerably meritorious effects can be derived when the present invention is incorporated in, for example, a liquid level detection sensor for dropscontaining intravenous bottles and the like.

The above and other objects, features and advantages of the present invention will become apparent from the following description and the appended claims, taken in conjunction with the accompanying drawings.

BRIEF DESCRIPTION OF THE DRAWINGS

In the accompanying drawings:

FIGS. 7 and 8 illustrate diagrammatically the waveform of a signal at the output terminal of each component of the circuit depicted in FIG. 4 when the circuit is actuated.

DETAILED DESCRIPTION OF THE INVENTION AND PREFERRED EMBODIMENTS

Figure 1:
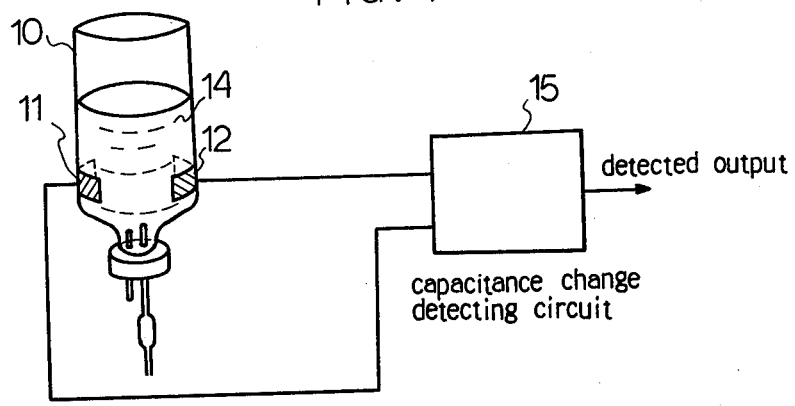
FIG. 1 is a simplified block diagram of a conventional capacitance sensor.
Figure 2:
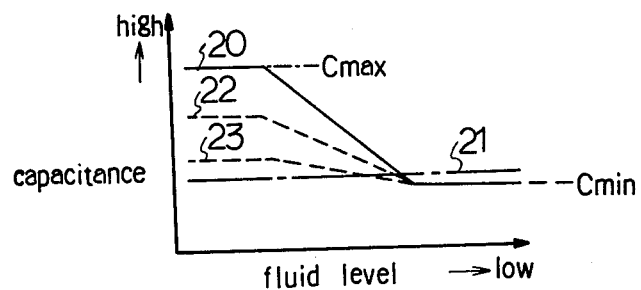
FIG. 2 illustrates diagrammatically the operation of the capacitance sensor shown in FIG. 1.
Figure 3:
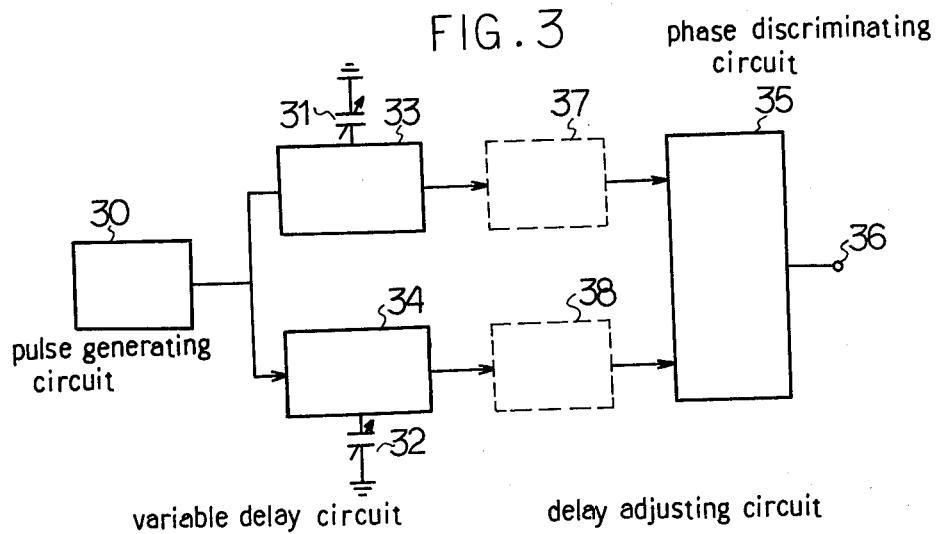
FIG. 3 is a block diagram illustrating the basic construction of this invention.

Referring first to FIG. 3, numeral 30 indicates a pulse generating circuit. Designated at numerals 31, 32 are transducers. Variable delay circuits are respectively indicated at numerals 33, 34. Numerals 35 and 36 are a phase discriminating circuit and output terminal respectively. Designated at numerals 37, 38 are optional delay adjusting circuits.

The capacitance sensor according to this invention is constructed, as shown in FIG. 3, by the pulse generating circuit 30, a plurality of (two in the illustrated embodiment) variable delay circuits 33, 34, which include their respective, separate transducers 31, 32 as their components, and are adapted to delay pulses from the pulse generating circuit 30 by time lags corresponding to capacitance values thereof and then output the thus-delayed pulses, and the phase discriminating circuit 35 which is adapted to discriminate a phase difference of the pulses output respectively from the plurality of variable delay circuits 33, 34 and then output measured information from an output terminal 36.

The above-mentioned plurality of transducers 31, 32 are disposed with a relative positional relationship, which is determined depending on measuring environments and measurement purposes, so that a change in a physical or chemical parameter or quantity to be measured can be converted into a relative difference in capacitance between the transducers 31 and 32. Since the variable delay circuits 33, 34 are capable of delaying pulses by time lags corresponding to the magnitudes of capacitances of their respective transducers 31, 32, pulses input to the variable delay circuits 33, 34 are respectively output with time lags corresponding to the magnitudes of capacitances of the transducers 31, 32. Therefore, a relative difference in capacitance between the transducers 31 and 32 may be detected if the phase difference between the pulses output from the their respective variable delay circuits 33, 34 is detected at the phase discriminating circuit 35. The detection of such a relative difference in capacitance between the transducers 31 and 32 permits the detection of a change in the physical or chemical quantity to be measured.

In other words, the capacitance sensor according to this invention, first of all, converts a change in physical or chemical quantity to be measured into a relative difference in capacitance between the transducers 31 and 32, and then converts the relative difference in capacitance into a phase difference, namely, a time lag between pulses, and finally detects the time lag so as to obtain the measurement information. Since unnecessary variables such as temperature changes have the same influence on the plurality of transducers and thus cancel each other out, it is not required to reset the detectable threshold level for every material or item to be measured. In addition, each capacitance change is detected after being converted into a time lag, whereby permitting a highly accurate detection. Furthermore, the accuracy of detection will not be affected at all by the accuracy of oscillation of the pulse generating circuit 30, thereby allowing the use of an inexpensive, economical oscillation circuit. The detection of each phase difference of pulses can be achieved by means of an inexpensive, economical circuit. Consequently, the capacitance sensor according to this invention may be reduced in both size and fabrication cost.

As the aforementioned transducers 31, 32, it is possible to adopt transducers of either one of the variable interelectrode spacing type in which the interelectrode spacing varies depending on each change in physical quantity, the variable area type in which the areas of mutually-opposing electrodes change in accordance with a change in physical quantity, and the variable dielectric constant type in which the dielectric constant of a substance placed between electrodes is changed depending on variations in physical or chemical quantity. The variable delay circuits 33, 34 may each be constructed by, for example, replacing the capacitor in a known delay circuit, such as R-C integrating circuit, L-C integrating circuit or low-pass filter, with the transducer capacitors 31,32 of the invention and then combining the thus-modified delay circuit mode a conventionally known binary circuit, such as a Schmidt trigger circuit. On the other hand, the phase discriminating circuit 35 may be constructed in any manner so long as it can detect each phase difference of the pulses. The output of the phase discriminating circuit 35 may be of either the analog or digital type.

Incidentally, delay adjusting circuits 37, 38 in FIG. 3 are each incorporated for adjustment of the extent of off-set of each pulse and output the pulses received from their corresponding variable delay circuits 33, 34 with desired time lags. The delay adjusting circuits 37, 38 may be constructed by, for example, one-shot multivibrators or the like. In the illustrated embodiment, the delay adjusting circuits 37, 38 are provided corresponding to their respective variable delay circuits 33, 34. It is however feasible to omit either one of the delay adjusting circuits 37, 38. Furthermore, the adjustment of the extent of off-set may be effected at locations other than the delay adjusting circuits 37, 38, for instance, at the variable delay circuits 33, 34. It is also feasible to perform a remote off-set adjustment through a precise digital delay adjustment by means of a combination of a clock pulse unit, presettable counter, gate, flip-flop, etc.

Next, reference will be made to FIG. 4 in which like reference numerals identify like elements of structure in FIG. 3. Numeral 40 indicates an inverted Schmidt circuit, whereas numerals 41, 42 and 43 represent normal Schmidt circuits respectively. Capacitors are shown at numerals 44, 45 while resistors are indicated at numerals 46 to 52. Designated at numeral 53 is a variable resistor that forms a delay adjusting circuit 54. Numeral 55 indicates an edge-clocked D-type flip-flop whose clock input terminal, data input terminal, output terminal and inverted output terminal are respectively shown at letters C, D, Q and $\overline{Q}$. Transistors are shown at numerals 56, 57. Numeral 58 indicates a light emitting diode. Incidentally, it is also feasible to use inverted Schmidt circuits as the Schmidt circuits 41, 42 and 43.

Figure 4:
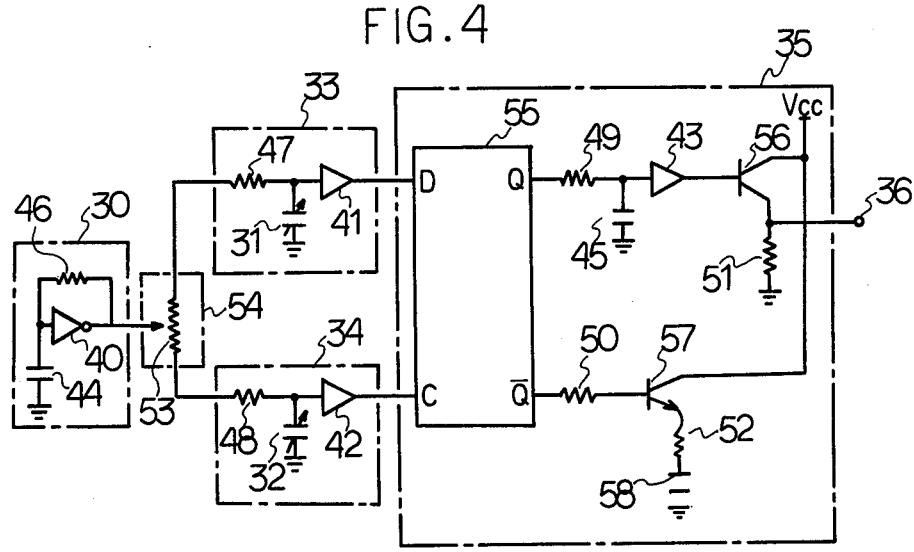
FIG. 4 is an electric circuit diagram of the capacitance sensor according to one embodiment of this invention, which capacitance sensor is applied used as a liquid level detection sensor.

In FIG. 4, the Schmidt circuit 40, capacitor 44 and resistor 46 forms a pulse generating circuit 30 which generates pulses in the form of a rectangular wave. Pulses generated by the circuit 30 are then input to variable delay circuits 33, 34 via the variable resistor which serves to adjust the extent of off-set (relative delay) of each pulse. The variable delay circuit 33 is constructed by an integrating circuit made of the resistor 47 and transducer 31 and the Schmidt circuit 41, and is adapted to delay each pulse from the pulse generating circuit 30 by a time lag corresponding to the magnitude of capacitance of the transducer 31 and then input the thus-delayed pulse to the data input terminal D of the D-type flip-flop 55. On the other hand, the variable delay circuit 34 is formed of an integrating circuit made of the resistor 48 and transducer 32 and the Schmidt circuit 42. Each pulse from the pulse generating circuit 30 is delayed at the variable delay circuit 34 by a time lag corresponding to the magnitude of capacitance of the transducer 32 and the thus-delayed pulse is then fed as an input to the clock input terminal C of the D-type flip-flop 55.

Figure 5:
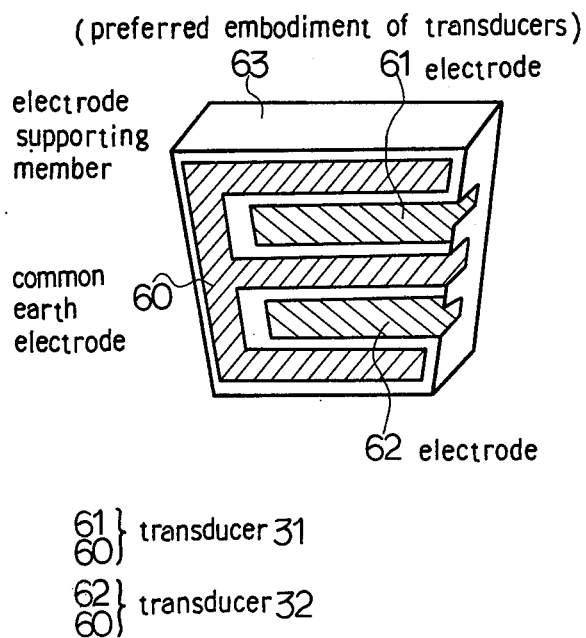
FIG. 5 is a perspective view of an example of the transducer.

The above-mentioned transducers 31, 32 are each of the variable dielectric constant type when they are used to detect a liquid level without making contact with the liquid. For example, as illustrated in FIG. 5, a common earth electrode 60 of comb-like shape and two electrodes 61, 62 may be adherently applied onto one side face of an electrode support member 63 as illustrated in the drawing, whereby constructing one of the transducers i.e., the transducer 31 by the electrode 61 and earth electrode 60 and the other transducer i.e, transducer 32 by the electrode 62 and earth electrode 60. Here, it is preferable for improving the adherence of the electrodes 60 to 63 to bottles to make the electrodes 60 to 63 with a flexible electrode material such as thin metal film, electrically-conductive rubber or electrically-conductive polyvinyl resin and the electrode support member 63 with a material having good cushioning capacity such as foamed polyurethane.

Figure 6:
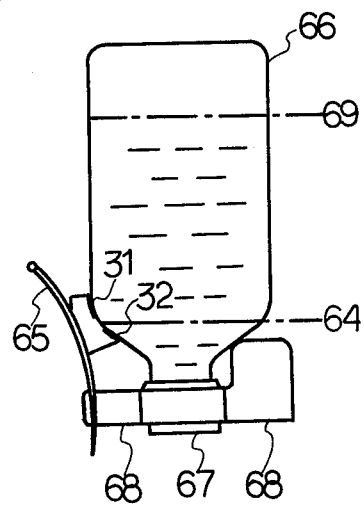
FIG. 6 is a schematic illustration showing the way of attachment of the transducer to a liquid containing bottle.

The transducers 31, 32 of the above-mentioned structure may be attached to a liquid containing bottle, for example, as shown in FIG. 6. Namely, the electrodes 60 to 62 may be brought into close abutment against the side wall of the bottle 66, for example, by means of an electrode-holding metallic retainer 65 such as a leaf spring in such a way that the transducers 31, 32 are positioned respectively above and below the liquid level 64 to be detected. Incidentally, the electrode-holding metallic retainer 65 is attached, displaceably up and down, to one end of a gripper 63 which clamps a metal cap 67 of the bottle 66, thereby permitting a one-touch application of the sensor and free adjustment of the sensor attachment position.

In FIG. 4, the D-type flip-flop 55 makes up the phase discriminating circuit 35 and converts data delivered to the data input terminal D into a binary code in accordance with the timing of the rise of each pulse to be fed to the clock terminal C and outputs the thus-converted output from the Q terminal and its inverted output from the $\overline{Q}$ terminal. The following table is a truth table of the D-type flip-flop 55.

| Clock Input | Data Input | Q Output | $\overline{Q}$ Output |
|---|---|---|---|
| Rise | "0" | "0" | "1" |
| Rise | "1" | "1" | "0" |
| Fall | X | Q (unchanged) | $\overline{Q}$ (unchanged) |

The Q terminal of the D-type flip-flop 55 is connected to the base of the transistor 56 through the resistor 49, a low-pass filter consisting of the capacitor 45 and the Schmidt circuit 43, whereas the output terminal 36 is connected to the emitter terminal of the same transistor 56. Thus, when the Q terminal is "1", the output will be "1", whereas when the " terminal is "0", the output will be "0". On the other hand, the $\overline{Q}$ terminal is connected through the resistor 50 to the base of the transistor 57, whose emitter terminal is connected to the light emitting diode 58. Therefore, the light emitting diode 58 is lit when the $\overline{Q}$ terminal is "1" but is not lit when the $\overline{Q}$ terminal is "0". $V_{cc}$ indicates an actuation power supply.

FIGS. 7 and 8, as mentioned above, illustrate diagrammatically the waveform of a signal at the output terminal of each component of the circuit depicted in FIG. 4 when the circuit is actuated. The operation of the sensor of the present embodiment will next be described with reference to FIGS. 7 and 8.

The sensor is first of all adjusted to make its output "0" when the liquid level is at a position sufficiently higher than the critical level 64 as shown by a line 69 in FIG. 6. This adjustment can be effected, for example, by adjusting the variable resistor 53 to change the integrating characteristics of the variable delay circuits 33, 34 so that the phase of a pulse to be fed to the data input terminal D of the D-type flip-flop 55 becomes somewhat delayed relative to its corresponding pulse to be applied to the clock input terminal C, as illustrated diagrammatically in FIG. 7. In the thus-adjusted and preset state, the output of the Q terminal will be "0" whereas the output of the $\overline{Q}$ terminal will be "1". Since the light emitting diode 58 is turned out immediately before the sensor is preset into a correct state, the presetting adjustment can be conveniently effected while watching the light emitting diode 58.

Subsequent to such a presetting adjustment, it is ready to initiate a measurement. When the liquid level gradually falls down as the drops of liquid are used and eventually approaches the critical level 64 indicated in FIG. 6, the capacitance of the upper transducer 31 becomes smaller compared with its previous capacitance because the dielectric constant of air is smaller than that of the liquid. Accordingly, the charging characteristics of the transducer 31 gradually becomes steeper as illustrated in FIG. 8 and eventually becomes equal to or steeper than the charging characteristics of the transducer 32, thereby reversing the phase difference between pulses supplied respectively to the data input terminal D and clock input terminal C of the D-type flip-flop 55. As a result, the output of the Q terminal of the D-type flip-flop 55 becomes "1" and the transistor 56 is rendered conductive, thereby detecting that the level of the liquid has reached the critical level.

By the way, owing to the functions of the low-pass filter consisting of the resistor 49 and capacitor 45 as well as the Schmidt circuit 43 shown in FIG. 4, it is possible to avoid chattering due to vibrations of the liquid level or the like and to obtain stable sensor outputs.

As has been described above, the liquid level detection sensor according to the present embodiment is constructed by symmetric circuits which function differentially and mutually cancel out unnecessary variables, whereby having, inter alia, the following merits:

(1) It is capable of detecting very small changes in capacitance with high sensitivity;

(2) It enjoys a high degree of stability and is hardly affected by the influence of environmental conditions such as temperature, humidity and the like to each component thereof or by variations in dielectric constant with the passage of time, depending on the types of bottles, or variations in temperature of a material under measurement i.e., liquid or the like;

(3) It features a high level of resistance to noises. Owing to this feature, it is stable to a voltage induced by the frequency of a commercially-available power supply. In addition, malfunctions due to pulsated noises can be reduced to a considerable extent. This is attributed to the fact that the present sensor is not affected by noise occurring at time points other than the rise time of each clock pulse, since the edge-clocked D-type flip-flop 55 used in the phase discriminating circuit discriminates only the state of its data input terminal during the rise time of each clock input pulse to be applied to its C terminal and holds its result until the rise time of its subsequent clock pulse. Furthermore, even if the Q output should become "1" due to an accidentally occurring pulsated noise, the Q output will immediately be returned to "0" by the next clock pulse and any momentary output is ignored by the subsequent low-pass filter and Schmidt circuit 43. Accordingly, the present sensor is safely protected from erroneous actuations. Countermeasures for noise thus either be omitted or a simple countermeasure for noise can be used, thereby resulting in another merit that the electrodes of each of the transducers 31, 32 may be formed into a simple construction; and (4) The present sensor can be reduced in size, weight and fabrication cost, because the pulse generating circuit, phase discriminating circuit and the like, making up the sensor can be easily fabricated using commercially-available, inexpensive CMOS, IC, etc.

The liquid level detection sensor according to this invention shall not be limited to the above-described structure and may be provided with a variety of other components or modified in many ways. For instance, it is feasible to analog-display outputs of the sensor at a meter or the like by taking the exclusive "or" of the outputs of the variable delay circuits 33, 34 and then subjecting same to integration.

Figures 9, 10:
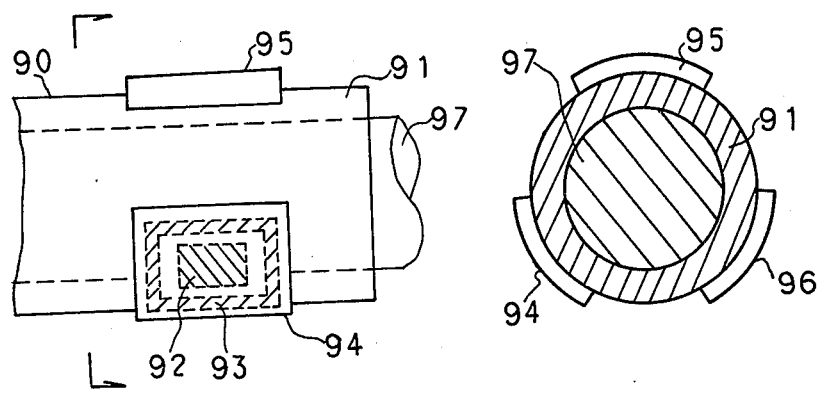
FIGS. 9 and 10 depict schematically a sensor for off-centered coverings of covered electric cables or wires.

The sensor according to this invention may also be employed, besides the above-mentioned liquid level detection sensor, as the following various sensors:

(1) By suitably modifying the configurations of both of the two electrodes to be disposed at different locations, as sensors for detecting the degree of parallelism or verticalness of a liquid level within a container or bottle;

(2) As a sensor for comparatively determining the amount of a substance in a container at a high speed, by comparing the amount of the substance in the container with a reference amount of the same substance in a container identical to the former container;

(3) As a sensor for detecting any quality change of an industrial or edible oil, by comparing the normal capacitance of the oil with the capacitance of another oil which is of the same type and amount as the former oil but has been oxidized, aged or denatured in another way; and (4) As a sensor for detecting off-centered covering of a covered electric cable or wire to determine, as shown in a plan view of FIG. 9 and a cross-sectional view of FIG. 10 taken along line A—A' of FIG. 9, whether a copper wire or cable 97 is centrally positioned in a covering 91, by for example closely applying a plurality of transducers 94 to 96, each being of the variable dielectric constant type and comprising planar electrodes 92, 93, on the outer circumference of the covering 91 and detecting relative changes in capacitance among the transducers 94 to 96. Use of such a sensor permits the measurement of the variations of the thickness of the covering on the wire or cable which it is being manufactured. Thus, it is feasible to automatically carry out a correction of variations in thickness of the covering immediately after the covering is applied by controlling its positioning jigs through a computerized control using the measurement results.

Having now fully described the invention, it will be apparent to one of ordinary skill in the art that many changes and modifications can be made thereto without departing from the spirit or scope of the invention as set forth herein.

What is claimed is:

1. A capacitance sensor comprising:
a pulse generating circuit;
a plurality of variable delay circuits connected to said pulse generating circuit, each including an integrating circuit having a variable capacitance transducer as an integrating capacitor so as to delay a pulse from said pulse generating circuit by a time lag corresponding to a capacitance value of said transducer and then output the thus-delayed pulse, and a binary circuit adapted to binary-code each output of said integrating circuit;
a phase discriminating circuit connected to said variable delay circuits for discriminating a phase difference of the pulses output respectively from said plurality of variable delay circuits and then output sensed information; and
at least one variable adjusting circuit connected to at least one of said variable delay circuits for adjustment the extent of an off-set of each pulse and output the pulses with desired time lags.

2. The capacitance sensor as claimed in claim 1, wherein said phase discriminating circuit comprises an edge-clocked D-type flip-flop for receiving the output pulses of said variable delay circuits as data inputs and clock inputs, a low-pass filter adapted to receive each output of said flip-flop and to avoid chattering due to vibration, and a binary circuit for binary-coding each output of the low-pass filter.

3. The capacitance sensor as claimed in claim 1, wherein said variable adjusting circuit is disposed between said variable delay circuits and said phase discriminating circuit.

4. The capacitance sensor as claimed in claim 1, wherein said variable adjusting circuit is disposed between said pulse generating circuit and said variable delay circuits.

* * * * *